(12) United States Patent
Hasegawa et al.

(10) Patent No.: US 6,709,881 B2
(45) Date of Patent: Mar. 23, 2004

(54) METHOD FOR MANUFACTURING SEMICONDUCTOR AND METHOD FOR MANUFACTURING SEMICONDUCTOR DEVICE

(75) Inventors: Yoshiaki Hasegawa, Katano (JP); Gaku Sugahara, Nara (JP); Ryoko Miyanaga, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/993,771

(22) Filed: Nov. 27, 2001

(65) Prior Publication Data

US 2002/0123166 A1 Sep. 5, 2002

(30) Foreign Application Priority Data

Nov. 28, 2000 (JP) ........................................ 2000-360615

(51) Int. Cl.[7] ............................................. H01L 21/00
(52) U.S. Cl. ........................... 438/24; 438/39; 438/740; 438/483
(58) Field of Search ..................... 438/22–46, 478–509, 438/738–740

(56) References Cited

U.S. PATENT DOCUMENTS

| | | | | |
|---|---|---|---|---|
| 5,583,880 A | * | 12/1996 | Shakuda | 372/46 |
| 5,757,835 A | * | 5/1998 | Ono et al. | 372/46 |
| 6,238,947 B1 | * | 5/2001 | Sahkuda | 438/94 |
| 6,323,052 B1 | * | 11/2001 | Horie et al. | 438/46 |
| 2002/0001864 A1 | * | 1/2002 | Ishijkawa et al. | 438/22 |
| 2002/0167018 A1 | * | 11/2002 | Nakamura et al. | 257/103 |

OTHER PUBLICATIONS

Chen et al, "Electrical and optical cahnges in the surface of reactvely ion etched n–GaN" Solid–state el;ectronics 43 (1999)649–652.*
Yang et al, "Effectiveness of multiple–pair buffer layer to improve the GaN layers grown by metallorganic chemical vapor deposition" Journal of Applied Physics vol. 85, No. 12, pp 8427–8431).*
S. Ito et al., "Light Confinement of Ridge–geometry InGaN Laser Diode", Japanese Journal of Applied Physics 61, p. 325, 7p–L–4, Sep. 2000 and English translation thereof.
Yves Lacroix et al., "Real–time etching depth monitoring for GaN–based laser diodes", Japanese Journal of Applied Physics 47, p. 378. 30a–YQ–7, Mar. 2000.
S. Tanaka et al., "Nano–masking effects during GaN quantum dot formation", Japanese Journal of Applied Physics 46, P. 363, 28p–N–6, Mar. 1999 and English translation thereof.
S. Tanaka et al., "Anti–Surfactant in III–Nitride Epitaxy–Quantum Dot Formation and Dislocation Termination", Japanese Journal of Applied Physics, vol. 39, (2000), pp. L831–L834 Part 2, No. 8B, Aug. 15, 2000.

* cited by examiner

*Primary Examiner*—Savitri Mulpuri
(74) *Attorney, Agent, or Firm*—McDermott, Will & Emery

(57) ABSTRACT

A method for manufacturing a semiconductor includes: a first step of forming an etching stop layer on a first semiconductor layer; and a second step of forming a second semiconductor layer made of a group III–V compound semiconductor on the etching stop layer. An etching rate for the etching stop layer by dry etching is less than an etching rate for the second semiconductor layer.

1 Claim, 13 Drawing Sheets

METHOD FOR MANUFACTURING SEMICONDUCTOR AND METHOD FOR MANUFACTURING SEMICONDUCTOR DEVICE

BACKGROUND OF THE INVENTION

The present invention relates to a method for manufacturing a group III–V compound semiconductor and a semiconductor device using the same.

In recent years, there is an increasing demand for a semiconductor laser element that outputs blue-violet light as a light source for a high-density optical disk of the next generation. Particularly, active researches and developments have been made for a light-emitting element made of a gallium nitride (GaN)-based group III–V compound semiconductor capable of operating in a relatively short wavelength range, i.e., a wavelength range of blue-violet light.

Since a gallium nitride-based semiconductor is chemically stable and has a high hardness, a wet etching method, which is used in a manufacturing process for other group III–V compound semiconductors such as gallium arsenide (GaAs) or indium phosphide (InP), cannot be used. Therefore, a dry etching method is usually used for etching a gallium nitride-based semiconductor.

However, a dry etching method, as compared with a wet etching method, is difficult to control so as to selectively etch a semiconductor layer to be etched or to stop etching at a desired thickness, for example.

For example, influences of the etching stop position in a semiconductor layer to be etched on the operating characteristics of a gallium nitride-based semiconductor laser element are reported in an article "Proc. of the 61st Meeting of the Japan Society of Applied Physics, Vol. 1, p.325 (7p-L-4), September 2000". In this article, it is stated that it is necessary to accurately control the post-etching thickness of a p-type cladding layer provided on an active layer in order to reduce the operating current of a semiconductor laser element.

Another article "Proc. of the 47th Meeting of the Japan Society of Applied Physics and Related Societies, Vol. 1, p.378 (30a-YQ-7), March 2000" contains a report on a measurement of a real-time depth in dry etching for a nitride-based semiconductor laser element. However, the article fails to report on a method for controlling the etching on a semiconductor layer.

A conventional dry etching process for a nitride-based semiconductor is performed on a layered structure of a plurality of semiconductor layers having different mixed crystal compositions such as $Al_xGa_{1-x}N$ (where 0.x.1). Therefore, the etching rates for the respective semiconductor layers are measured in advance, and the process is performed while managing the etching time based on the measured etching rates.

However, with the conventional dry etching method for a group III–V compound semiconductor, it is necessary to measure and manage the etching rate for each of the semiconductor layers having different compositions. In addition, it is necessary to control and manage dry etching conditions such as the temperature and the plasma state, thereby decreasing the productivity and the yield and increasing the cost.

SUMMARY OF THE INVENTION

An object of the present invention is to solve the problems in the prior art and to make it possible to easily and reliably control an etching process on a group III–V compound semiconductor.

In order to achieve the object, the present invention provides an etching stop layer in at least a portion of an area under a group III–V compound semiconductor to be etched.

Specifically, a method for manufacturing a semiconductor of the present invention includes: a first step of forming an etching stop layer on a first semiconductor layer; and a second step of forming a second semiconductor layer made of a group III–V compound semiconductor on the etching stop layer, wherein an etching rate for the etching stop layer by dry etching is less than an etching rate for the second semiconductor layer.

According to the method for manufacturing a semiconductor of the present invention, the etching rate for the etching stop layer by dry etching is less than the etching rate for the second semiconductor layer. Therefore, it is possible to selectively dry-etch the second semiconductor layer, whereby it is possible to prevent the first semiconductor layer from being overetched. Thus, the controllability of the dry etching process on the second semiconductor layer, which is made of a group III–V compound semiconductor, is improved.

In the method for manufacturing a semiconductor of the present invention, it is preferred that in the first step, the etching stop layer is formed by using a group III–V compound semiconductor containing aluminum. When the etching stop layer is made of a group III–V compound semiconductor, the etching stop layer becomes a compound semiconductor equivalent to the second semiconductor layer, thereby eliminating the possibility for the crystallinity of the second semiconductor layer to be deteriorated. Moreover, the etching resistance of the group III–V compound semiconductor containing aluminum is improved, thereby resulting in a good selectivity of dry etching on the second semiconductor layer. In addition, it is possible to form the etching stop layer using a normal semiconductor manufacturing apparatus as it is.

In such a case, it is preferred that: the second semiconductor layer contains aluminum; and in the first step, the etching stop layer is formed so that an aluminum composition of the etching stop layer is greater than an aluminum composition of the second semiconductor layer. In this way, since a group III–V compound semiconductor that has the greater aluminum composition has a smaller etching rate, the etching stop layer can reliably exert its function.

In the method for manufacturing a semiconductor of the present invention, it is preferred that in the first step, the etching stop layer is a super lattice layer obtained by alternately layering $Al_xGa_{1-x}N$ (where 0.x.1) and $Al_yGa_{1-y}N$ (where 0.y.1 and x≠y) on one another.

In such a case, it is preferred that the etching stop layer is a reflector mirror having a thickness such as to reflect light whose wavelength is equal to or greater than about 360 nm and less than or equal to 500 nm. In this way, when a laser element is produced from the manufactured semiconductor, the spontaneous emission light emitted from the laser element can be effectively guided as induced emission light while preventing it from leaking to the outside.

In the method for manufacturing a semiconductor of the present invention, it is preferred that the etching stop layer is made of an element included in a group III–V nitride semiconductor and an impurity element that determines a conductivity of the group III–V nitride semiconductor. In this way, where the second semiconductor layer is a group III–V nitride semiconductor, it is not necessary to provide an additional material for forming the etching stop layer. Therefore, it is possible to easily and reliably form the etching stop layer without having to add any modifications to the semiconductor manufacturing apparatus.

In such a case, it is preferred that the element included in the group III–V nitride semiconductor is nitrogen, and the impurity element is silicon. In this way, where the second semiconductor layer is made of a group III–V nitride semiconductor, the etching stop layer can be provided by an insulative film made of silicon nitride, for example, by using ammonium as a nitrogen source and a silane gas as a silicon source, for example. As a result, the etching selectivity ratio with respect to the second semiconductor layer can be increased, thereby improving the etching controllability for the second semiconductor layer.

Alternatively, in such a case, it is preferred that the impurity element is magnesium. In this way, the etching stop layer exhibits a p-conductivity type, and it is possible to obtain an etching stop layer having a good conductivity, whereby when a semiconductor element is formed from the obtained semiconductor, it is less likely to adversely affect the operating characteristics of the element.

In such a case, it is preferred that an impurity concentration of magnesium is about $1 \times 10^{20}$ cm$^{-3}$ or more. When the magnesium impurity concentration in the group III–V nitride semiconductor is set to be about $1 \times 10^{20}$ cm$^{-3}$ or more, the etching rate decreases, thereby improving the etching controllability for the second semiconductor layer.

In the method for manufacturing a semiconductor of the present invention, it is preferred that: the method further includes a third step of performing a dry etching process on the second semiconductor layer, before the second step; and in the third step, the etching process on the second semiconductor layer is stopped upon detecting the etching stop layer. In this way, the etching stop layer can be determined during the dry etching process on the second semiconductor layer, whereby it is possible to reliably etch the second semiconductor layer.

In such a case, it is preferred that the third step includes the steps of: irradiating a surface of the second semiconductor layer with a laser beam; receiving photoluminescence light emitted through excitation by the laser beam; and assuming that a surface of the etching stop layer has been exposed by detecting a change in a wavelength of the received photoluminescence light.

Alternatively, in such a case, it is preferred that the third step includes the steps of: irradiating a surface of the second semiconductor layer with X rays; measuring a diffraction angle of the X rays; and assuming that a surface of the etching stop layer has been exposed by detecting a change in the diffraction angle of the X rays.

A method for manufacturing a semiconductor device of the present invention includes the steps of: sequentially forming a first semiconductor layer including an active layer, an etching stop layer, and a second semiconductor layer made of a group III–V compound semiconductor; and selectively dry-etching the second semiconductor layer, wherein an etching rate for the etching stop layer by dry etching is less than an etching rate for the second semiconductor layer.

According to the method for manufacturing a semiconductor device of the present invention, the second semiconductor layer, which is made of a group III–V compound semiconductor, is formed on the etching stop layer. The etching rate for the etching stop layer by dry etching is less than the etching rate for the second semiconductor layer. Therefore, it is possible to selectively dry-etch the second semiconductor layer, whereby the second semiconductor layer will not be left in the etching area while the first semiconductor layer will not be etched. Thus, the controllability of the dry etching process on the second semiconductor layer, which is made of a group III–V compound semiconductor, is improved.

EMBODIMENTS OF THE INVENTION

First Embodiment

A first embodiment of the present invention will be described with reference to the drawings.

FIG. 1(a) to FIG. 1(c) to FIG. 5(a) to FIG. 5(c) are cross-sectional views sequentially illustrating steps of a method for manufacturing a semiconductor according to the first embodiment of the present invention, and a method for manufacturing a semiconductor laser device using the semiconductor.

The first embodiment makes it possible to easily and reliably obtain an etching selectivity for a p-type cladding layer to be etched, in the step of processing a ridge portion by dry etching for producing a semiconductor laser device from a group III–V nitride semiconductor provided with an etching stop layer.

First, a substrate 11 having a diameter of about 5.1 cm (2 inches) and made of sapphire is prepared, and the surface thereof is washed with an acidic aqueous solution. Then, the washed substrate 11 is held in a susceptor (not shown) in a reactor of a metal organic vapor phase epitaxy (MOVPE) apparatus, for example, and the reactor is evacuated to achieve a vacuum. Then, thermal cleaning of the substrate surface is performed for about 10 minutes with the inside of the reactor being a hydrogen atmosphere having a pressure of about 300×133.322 Pa (300 Torr), and with the temperature being increased to about 1100° C. to heat the substrate 11.

Figure 1A:
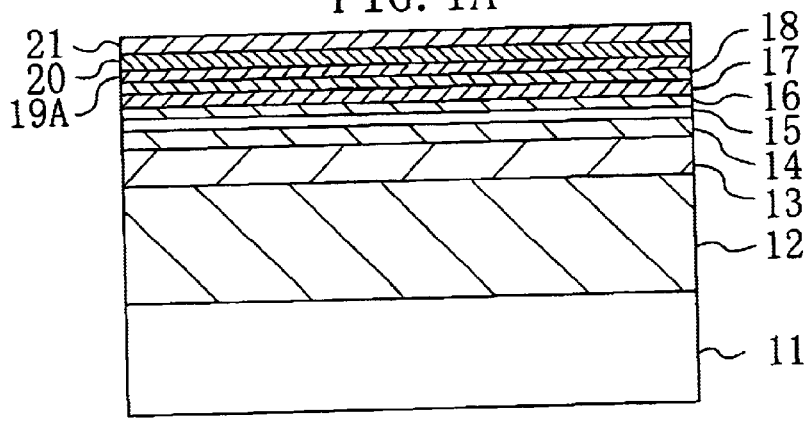
FIG. 1(a) to FIG. 1(c) are cross-sectional views sequentially illustrating steps of a method for manufacturing a semiconductor according to a first embodiment of the present invention, and a method for manufacturing a semiconductor laser device using the semiconductor.

Then, as illustrated in FIG. 1(a), the temperature of the reactor is decreased to about 500° C., after which trimethylgallium (TMG) at a flow rate of about 25 μmol/min, and an ammonium ($NH_3$) gas at a flow rate of about 7.5 L/min, and a carrier gas made of hydrogen, are simultaneously supplied onto the substrate 11, thereby growing a low-temperature buffer layer (not shown) having a thickness of about 20 nm and made of gallium nitride (GaN). At this time, the value of the flow rate ratio between the ammonium gas, which is a group V material, and TMG, which is a group III material, is about 6500.

Then, the temperature inside the reactor is increased to about 1000° C., and a silane ($SiH_4$) gas as an n-type dopant is additionally supplied, so as to grow, on the low-temperature buffer layer, an n-type contact layer 12 having a thickness of about 4 μm and made of n-type GaN with a silicon (Si) impurity concentration of about $1 \times 10^{18}$ $cm^{-3}$. Then, trimethylaluminum (TMA) as a group III material is additionally supplied onto the n-type contact layer 12, so as to grow an n-type cladding layer 13 having a thickness of about 0.7 μm and made of n-type $Al_{0.07}Ga_{0.93}N$ with an Si impurity concentration of $5 \times 10^{17}$ $cm^{-3}$. Then, an n-type light guide layer 14 having a thickness of about 100 nm and made of n-type GaN with an Si impurity concentration of about $1 \times 10^{18}$ $cm^{-3}$ is grown on the n-type cladding layer 13.

Then, the temperature inside the reactor is decreased to about 800° C., and the carrier gas is changed from hydrogen to nitrogen, so as to grow a multiple quantum well (MQW) active layer 15 by alternately layering three strained quantum well layers each having a thickness of about 3 nm and made of $In_{0.1}Ga_{0.9}N$ and two barrier layers each having a thickness of about 9 nm and made of GaN. TMI and TMG are supplied as group III materials while growing a strained quantum well layer, and TMG is supplied as a group III material while growing a barrier layer.

Then, the temperature inside the reactor is again increased to about 1000° C., and the carrier gas is changed from nitrogen back to hydrogen, so as to grow, on the MQW active layer 15, a cap layer 16 having a thickness of about 20 nm and made of p-type $Al_{0.15}Ga_{0.85}N$ with an Mg impurity concentration of about $5 \times 10^{17}$ $cm^{-3}$ while supplying TMA and TMG as group III materials, an ammonium gas as a group V material, and a biscyclopentadienyl magnesium ($Cp_2Mg$) gas as a p-type dopant, onto the substrate 11. Then, a p-type light guide layer 17 having a thickness of about 100 nm and made of p-type GaN with an Mg impurity concentration of about $1 \times 10^{18}$ $cm^{-3}$ is grown on the cap layer 16 by stopping the supply of TMA.

Then, TMA is added to the group III material, so as to grow, on the p-type light guide layer 17, a p-type first cladding layer 18 having a thickness of about 200 nm and made of p-type $Al_{0.07}Ga_{0.93}N$ with an Mg impurity concentration of $5 \times 10^{17}$ $cm^{-3}$. Then, an etching stop layer 19A having an aluminum composition greater than that of the p-type first cladding layer 18, having a thickness of about 50 nm and made of p-type $Al_{0.10}Ga_{0.90}N$ with an Mg impurity concentration of about $5 \times 10^{17}$ $cm^{-3}$ is grown on the p-type first cladding layer 18. Then, a p-type second cladding layer 20 having a thickness of about 0.4 μm and made of p-type $Al_{0.07}Ga_{0.93}N$ with an Mg impurity concentration of about $5 \times 10^{17}$ $cm^{-3}$ is grown on the etching stop layer 19A.

When a ridge portion for current constriction is formed in a p-type semiconductor layer by a dry etching method, the etching is stopped at the etching stop layer 19A, whereby the post-etching remaining thickness of the p-type semiconductor layer that optically functions as a p-type cladding layer is about 250 nm, including the p-type first cladding layer 18 having a thickness of about 200 nm and the etching stop layer 19A having a thickness of about 50 nm. Herein, the post-etching remaining thickness of a semiconductor layer refers to a design thickness of a portion of the semiconductor layer that is intended to be left after etching. Then, a p-type contact layer 21 having a thickness of about 0.1 μm and made of p-type GaN with an Mg impurity concentration of $1 \times 10^{18}$ $cm^{-3}$ is grown on the p-type second cladding layer 20.

Figure 1B:
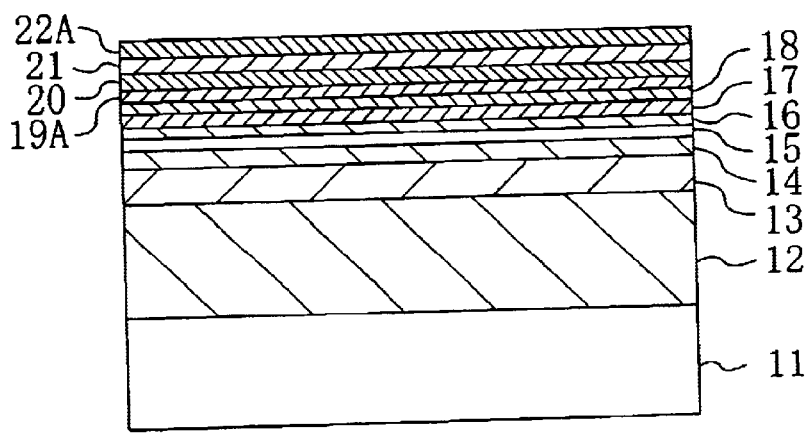

Then, as illustrated in FIG. 1(b), the substrate 11, with layers up to the p-type contact layer 21 having been grown thereon, is taken out of the reactor, and the surface of the p-type contact layer 21 is washed with an organic solvent and further cleaned by wet etching with a hydrogen fluoride-based etchant, after which a first oxide insulative film 22A having a thickness of about 0.1 μm and made of silicon dioxide ($SiO2$) is deposited across the entire surface of the p-type contact layer 21 by using a plasma CVD method, for example.

Figure 1C:
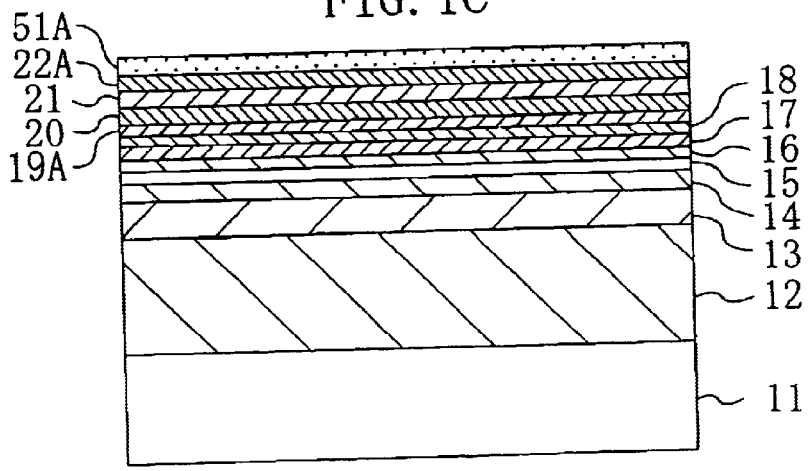

Then, as illustrated in FIG. 1(c), a first resist film 51A is applied across the entire surface of the first oxide insulative film 22A by using a spinner.

Figure 2A:
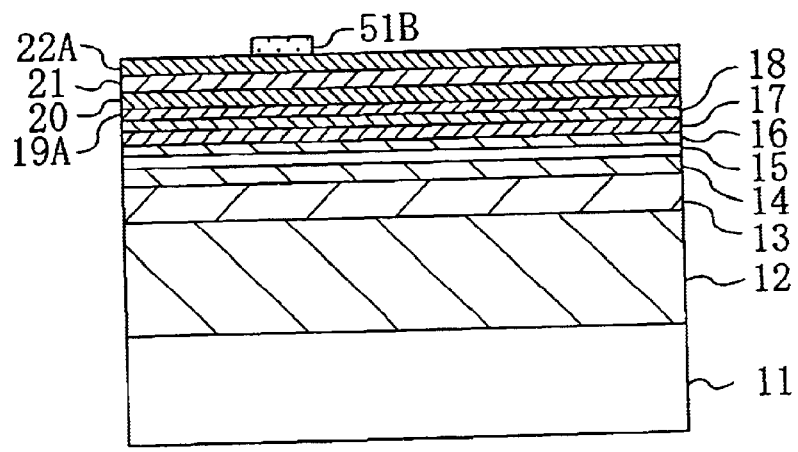
FIG. 2(a) to FIG. 2(c) are cross-sectional views sequentially illustrating steps of the method for manufacturing a semiconductor according to the first embodiment of the present invention, and the method for manufacturing a semiconductor laser device using the semiconductor.

Then, as illustrated in FIG. 2(a), a first resist pattern 51B having a stripe pattern with a mask width of about 2 μm and a pitch of about 500 μm is formed from the first resist film 51A by a photolithography method so that the first resist pattern 51B extends along the <1–100> orientation of a crystal zone axis of the gallium nitride crystal. Note that in the present specification, the inversion of an index representing a crystal zone axis is denoted by adding a negative sign "−" in front of the index being inverted, for the purpose of illustration.

Figure 2B:
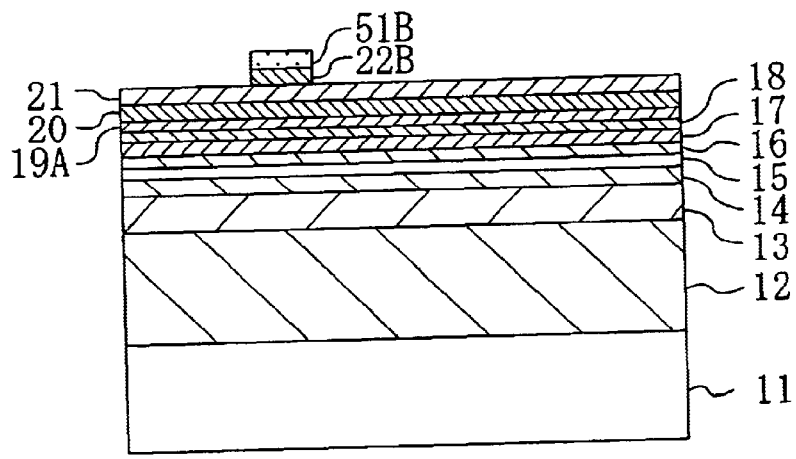
Figure 2C:
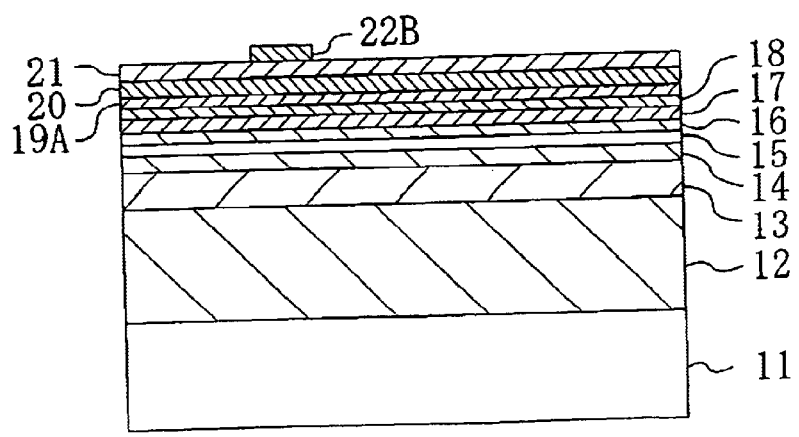

Then, as illustrated in FIG. 2(b), the first oxide insulative film 22A is wet-etched with a hydrogen fluoride-based aqueous solution using the first resist pattern 51B as a mask, thereby forming a first insulative pattern 22B, onto which a stripe shape has been transferred, from the first oxide insulative film 22A. Then, as illustrated in FIG. 2(c), the first resist pattern 51B is removed by an organic solvent.

Figure 3A:
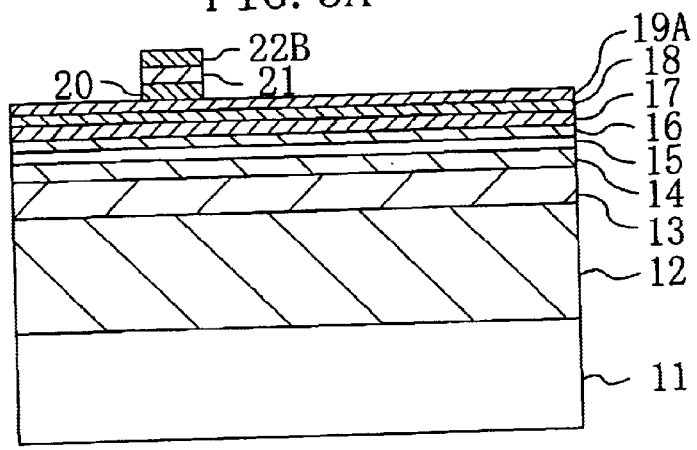
FIG. 3(a) to FIG. 3(c) are cross-sectional views sequentially illustrating steps of the method for manufacturing a semiconductor according to the first embodiment of the present invention, and the method for manufacturing a semiconductor laser device using the semiconductor.

Then, as illustrated in FIG. 3(a), the p-type second cladding layer 20 is dry-etched with a chlorine ($Cl_2$) gas, for example, using the first insulative pattern 22B as a mask, thereby patterning the p-type second cladding layer into a ridge shape, onto which the first insulative pattern 22B has been transferred. Herein, the etching of the p-type second cladding layer 20 is performed based on a predetermined etching time.

In the first embodiment, since the etching stop layer 19A is provided under the p-type second cladding layer 20 to be etched, the margin of the etching time is increased, thereby preventing the p-type first cladding layer 18 from being etched while ensuring a predetermined thickness, and thus obtaining predetermined optical characteristics.

Figure 3B:
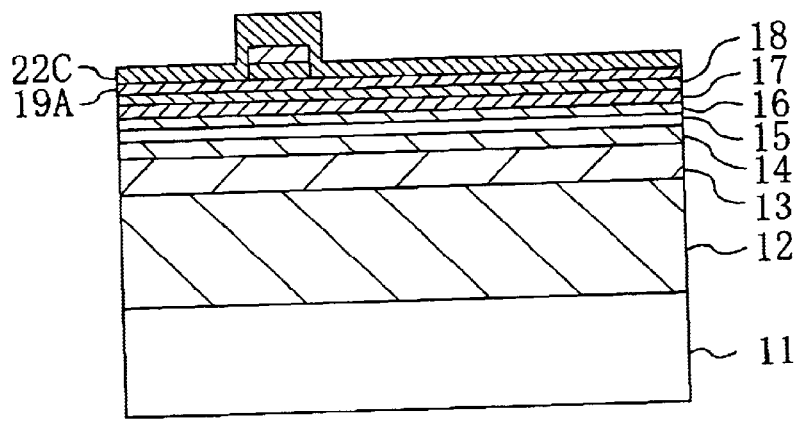

Then, as illustrated in FIG. 3(b), a second oxide insulative film 22C having a thickness of about 0.1 μm and made of silicon dioxide is deposited across the entire surface of the etching stop layer 19, including the p-type second cladding layer 20, the p-type contact layer 21 and the first insulative pattern 22B, which have been made into a ridge shape, by using a plasma CVD method.

Figure 3C:
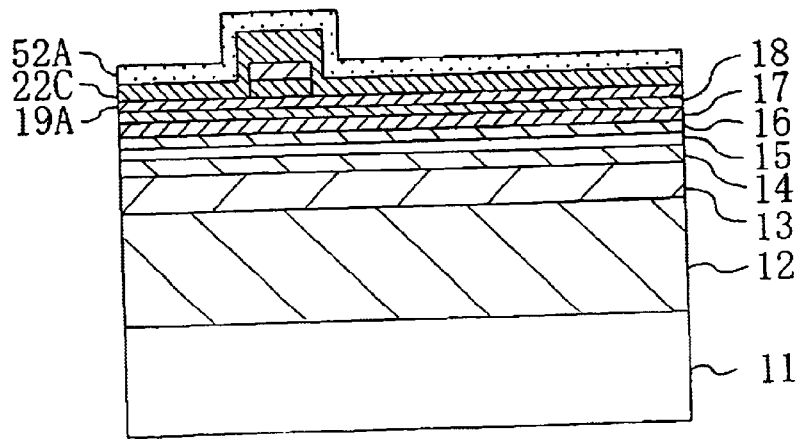

Then, as illustrated in FIG. 3(c), a second resist film 52A is applied across the entire surface of the second oxide insulative film 22C by using a spinner.

Figure 4A:
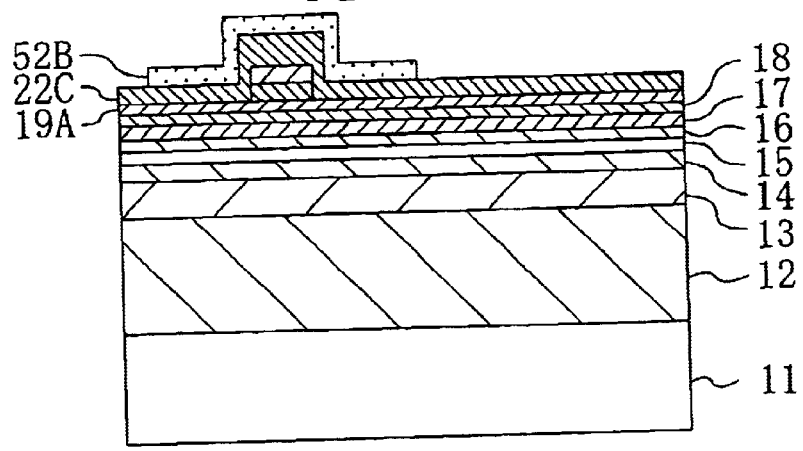
FIG. 4(a) to FIG. 4(c) are cross-sectional views sequentially illustrating steps of the method for manufacturing a semiconductor according to the first embodiment of the present invention, and the method for manufacturing a semiconductor laser device using the semiconductor.

Then, as illustrated in FIG. 4(a), a second resist pattern 52B having a stripe pattern with a mask width of about 40 μm and a pitch of about 500 μm is formed from the second resist film 52A by a photolithography method so that the second resist pattern 52B extends along the <1−100> orientation of a crystal zone axis of the gallium nitride crystal while covering the p-type contact layer 21 in a central portion thereof.

Figure 4B:
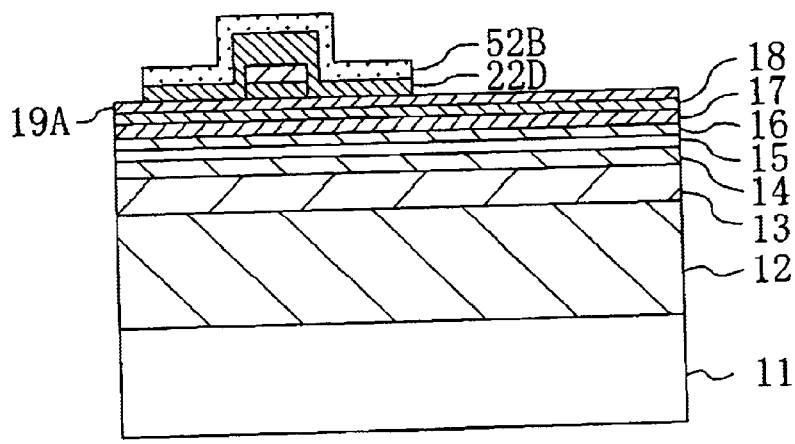
Figure 4C:
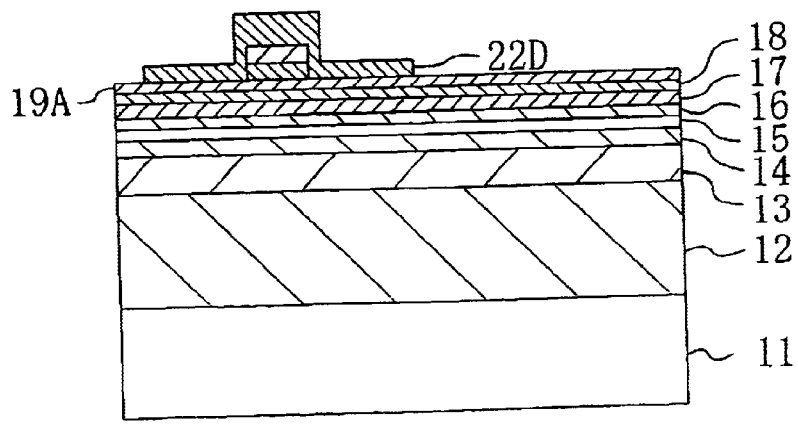

Then, as illustrated in FIG. 4(b), the second oxide insulative film 22C is wet-etched with a hydrogen fluoride-based aqueous solution using the second resist pattern 52B as a mask, thereby forming a second insulative pattern 22D, onto which the stripe shape of the second resist pattern 52B has been transferred, from the second oxide insulative film 22C. Then, as illustrated in FIG. 4(c), the second resist pattern 52B is removed by an organic solvent.

Figure 5A:
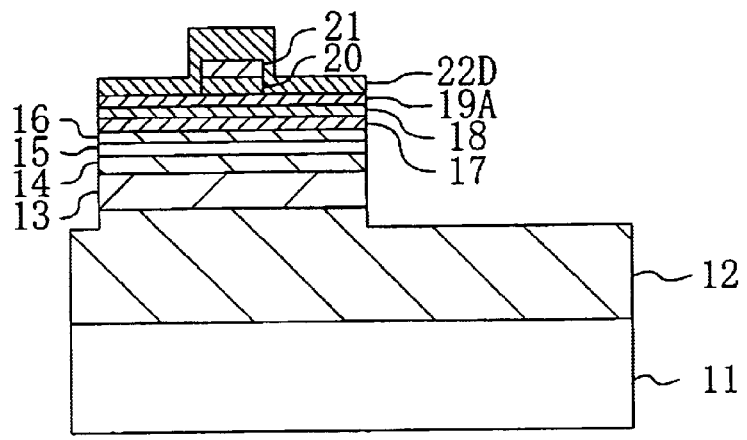
FIG. 5(a) to FIG. 5(c) are cross-sectional views sequentially illustrating steps of the method for manufacturing a semiconductor according to the first embodiment of the present invention, and the method for manufacturing a semiconductor laser device using the semiconductor.

Then, as illustrated in FIG. 5(a), a dry etching process using a chlorine ($Cl_2$) gas, for example, is performed using the second insulative pattern 22D as a mask until the n-type contact layer 12 is exposed.

Figure 5B:
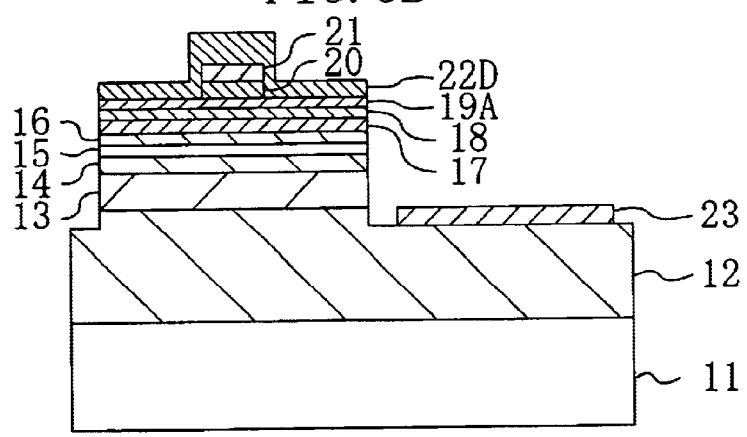

Then, as illustrated in FIG. 5(b), an n-side electrode 23 made of a layered structure of titanium (Ti) and aluminum (Al) is formed on the exposed upper surface of the n-type contact layer 12 by a vapor deposition method, or the like.

Figure 5C:
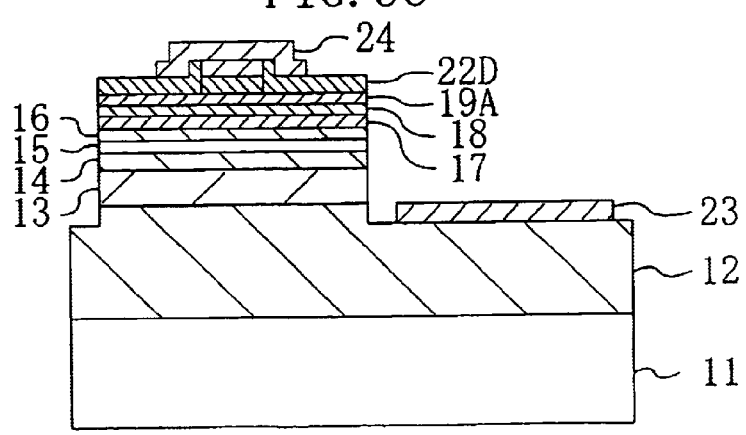

Then, as illustrated in FIG. 5(c), the second insulative pattern 22D is selectively wet-etched with a hydrogen fluoride-based aqueous solution so as to expose the p-type contact layer 21. Then, a p-side electrode 24 made of a layered structure of nickel (Ni) and gold (Au) and electrically connected to the p-type contact layer 21 is formed on the upper surfaces of the second insulative pattern 22D and the p-type contact layer 21 by a vapor deposition method, or the like.

Then, although not shown, a cavity structure of a laser element is formed through a dry etching process and a cleavage process, after which high reflection coatings made of silicon dioxide and titanium dioxide having reflectances of 90% and 70%, respectively, are formed on the respective facets of the cleaved cavity. Herein, the cavity length is about 1 mm.

As described above, the first embodiment is characterized in that the etching stop layer 19 for dry etching is formed under a semiconductor layer to be etched among the semiconductor layers of a semiconductor laser element.

Desirable operating characteristics can be achieved, as will be described below, by producing a semiconductor laser device from semiconductor layers including the etching stop layer 19.

In the semiconductor laser device of the first embodiment, an etching time margin is provided by the etching stop layer 19A, which is made of p-type $Al_{0.10}Ga_{0.90}N$ and which is provided under the p-type second cladding layer 20, when performing a dry etching process on the p-type second cladding layer 20 to be etched in the dry etching step illustrated in FIG. 3(a). This is because the etching rate for the etching stop layer 19A is less than the etching rate for the p-type second cladding layer 20 as the Al composition, which is 0.10, is greater than the Al composition of the p-type second cladding layer 20, which is 0.07.

Therefore, while the etching amount (depth) for the p-type second cladding layer 20 is controlled by time, even when the etching time exceeds the predetermined time, the etching rate for the etching stop layer 19A is less than the etching rate for the p-type second cladding layer 20. Therefore, it is possible to easily and reliably leave a predetermined thickness of the p-type first cladding layer 18, thus improving the thickness controllability in a dry etching process.

It has been confirmed that when a direct current is actually applied, at room temperature, to a semiconductor laser device produced according to the first embodiment, it achieves a continuous oscillation operation with a laser oscillation threshold current of about 45 mA and a slope efficiency of about 1.0 W/A.

On the other hand, a conventional semiconductor laser device, which is not provided with the etching stop layer 19A, also continuously oscillates at room temperature, but the threshold current is about 70 mA and the slope efficiency is about 0.5 W/A.

Thus, according to the first embodiment, the etching stop layer 19A is formed under the p-type second cladding layer 20 to be etched, whereby it is possible to control the thickness (remaining thickness) of the p-type first cladding layer 18 with a high precision. Therefore, underetching of the p-type second cladding layer 20 does not occur, while it is possible to obtain a desired thickness, i.e., an optimal value, for the thickness of the p-type first cladding layer 18. As a result, the light confinement efficiency in the MQW active layer 15 is significantly improved. This is because of the prevention of an etching damage to the MQW active layer 15.

Moreover, the formation of the etching stop layer 19A on the substrate 11 suppresses variations in the etching remaining thickness across the surface of the substrate whose diameter is about 5.1 cm, thereby improving the yield of the semiconductor laser device and thus significantly contributing to a cost reduction.

First Variation of First Embodiment

A first variation of the first embodiment of the present invention will now be described with reference to the drawings.

Figure 6:
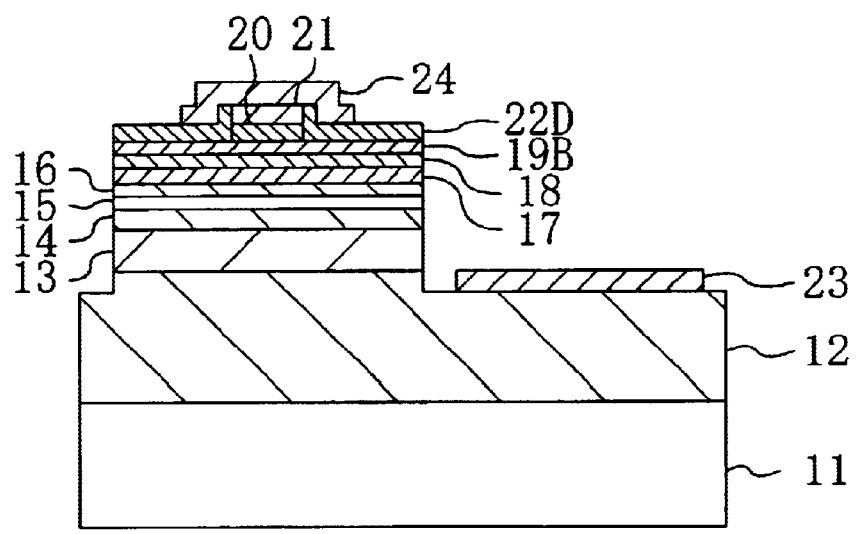
FIG. 6 is a cross-sectional view illustrating a method for manufacturing a semiconductor according to a first variation of the first embodiment of the present invention, and a semiconductor laser device using the semiconductor.

FIG. 6 is a cross-sectional view illustrating a method for manufacturing a semiconductor according to the first variation of the first embodiment of the present invention, and a semiconductor laser device using the semiconductor. In FIG. 6, those components illustrated in FIG. 5(c) are provided with the same reference numerals and will not be further described below.

An etching stop layer 19B of the first variation is characterized in that it is formed as a super lattice structure. The method for forming the etching stop layer 19B will be described with reference to FIG. 7.

Figure 7:
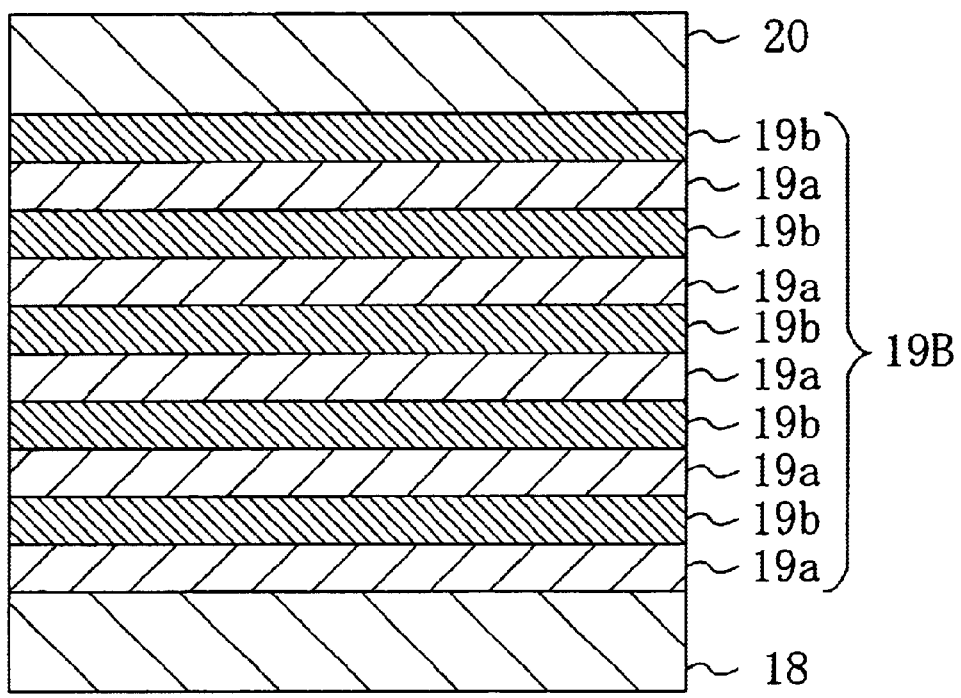
FIG. 7 is a cross-sectional view illustrating an etching stop layer in the method for manufacturing a semiconductor according to the first variation of the first embodiment of the present invention.

FIG. 7 is a cross-sectional view illustrating the etching stop layer 19B according to the first variation.

First, as illustrated in FIG. 7, the p-type first cladding layer 18 made of p-type $Al_{0.07}Ga_{0.93}N$ is grown by an MOVPE method, or the like, as in the first embodiment, after which five pairs of a first layer 19a having a thickness of about 5 nm and made of p-type $Al_{0.10}Ga_{0.90}N$ with an Mg impurity concentration of about $5\times10^{17}$ $cm^{-3}$ and a second layer 19b having a thickness of about 5 nm and made of p-type $Al_{0.02}Ga_{0.98}N$ with an Mg impurity concentration of about $5\times10^{17}$ $cm^{-3}$ are grown, thereby forming the etching stop layer 19B having a super lattice structure with a total thickness of about 50 nm.

Then, the p-type second cladding layer 20 having a thickness of about 0.4 μm and made of p-type $Al_{0.07}Ga_{0.93}N$ with an Mg impurity concentration of about $5\times10^{17}$ $cm^{-3}$ is grown on the etching stop layer 19B.

Thereafter, as in the first embodiment, the p-type contact layer 21 is formed, and the p-type contact layer 21 and the p-type second cladding layer 20 are dry-etched into a ridge shape until the etching stop layer 19B is exposed. Moreover, a dry etching process is performed to provide the n-side electrode 23, and the p-side electrode 24 is formed.

In the semiconductor laser device of the first variation, an etching time margin is provided by the etching stop layer 19B, which has a super lattice structure with five pairs of the first layer 19a made of p-type $Al_{0.10}Ga_{0.90}N$ and the second layer 19b made of p-type $Al_{0.02}Ga_{0.98}N$ and which is provided under the p-type second cladding layer 20, when performing a dry etching process on the p-type second cladding layer 20. This is because of the etching rate for the etching stop layer 19B. Although the average Al composition, which is 0.06, is less than the Al composition of the p-type second cladding layer 20, which is 0.07, the Al composition of the second layer 19b of the super lattice structure, which is 0.10, is greater than the Al composition of the p-type second cladding layer 20.

Therefore, while the etching amount (depth) for the p-type second cladding layer 20 is controlled by time, even when the etching time exceeds the predetermined time, the etching rate for the etching stop layer 19B is less than the etching rate for the p-type second cladding layer 20. Therefore, it is possible to easily and reliably leave a predetermined thickness of the p-type first cladding layer 18, thus improving the thickness controllability in a dry etching process.

It has been confirmed that when a direct current is actually applied, at room temperature, to a semiconductor laser device produced according to the first variation, it achieves a continuous oscillation operation with a laser oscillation threshold current of about 45 mA and a slope efficiency of about 1.0 W/A.

Thus, according to the first variation, the etching stop layer 19B having a super lattice structure is formed under the p-type second cladding layer 20 to be etched, whereby it is possible to control the thickness (remaining thickness) of the p-type first cladding layer 18 with a high precision. As a result, it is possible to obtain a desired thickness, i.e., an optimal value, for the thickness of the p-type first cladding layer 18. Therefore, the light confinement efficiency in the MQW active layer 15 is significantly improved. This is because of the prevention of an etching damage to the MQW active layer 15.

Moreover, the formation of the etching stop layer 19B on the substrate 11 suppresses variations in the etching remaining thickness across the surface of the substrate whose diameter is about 5.1 cm, thereby improving the yield of the semiconductor laser device and thus significantly contributing to a cost reduction.

Second Variation of First Embodiment

A second variation of the first embodiment of the present invention will now be described with reference to the drawings.

Figure 8:
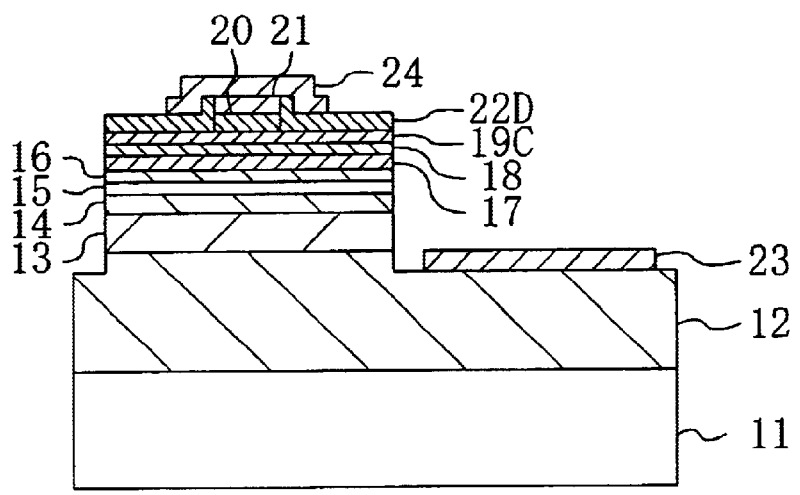
FIG. 8 is a cross-sectional view illustrating a method for manufacturing a semiconductor according to a second variation of the first embodiment of the present invention, and a semiconductor laser device using the semiconductor.

FIG. 8 is a cross-sectional view illustrating a method for manufacturing a semiconductor according to the second variation of the first embodiment of the present invention, and a semiconductor laser device using the semiconductor. In FIG. 8, those components illustrated in FIG. 5(c) are provided with the same reference numerals and will not be further described below.

An etching stop layer 19C of the second variation is characterized in that it is formed as a super lattice structure that serves as a Bragg reflector mirror. This improves the light confinement efficiency in the MQW active layer 15 while obtaining effects as those of the second variation.

Figure 9:
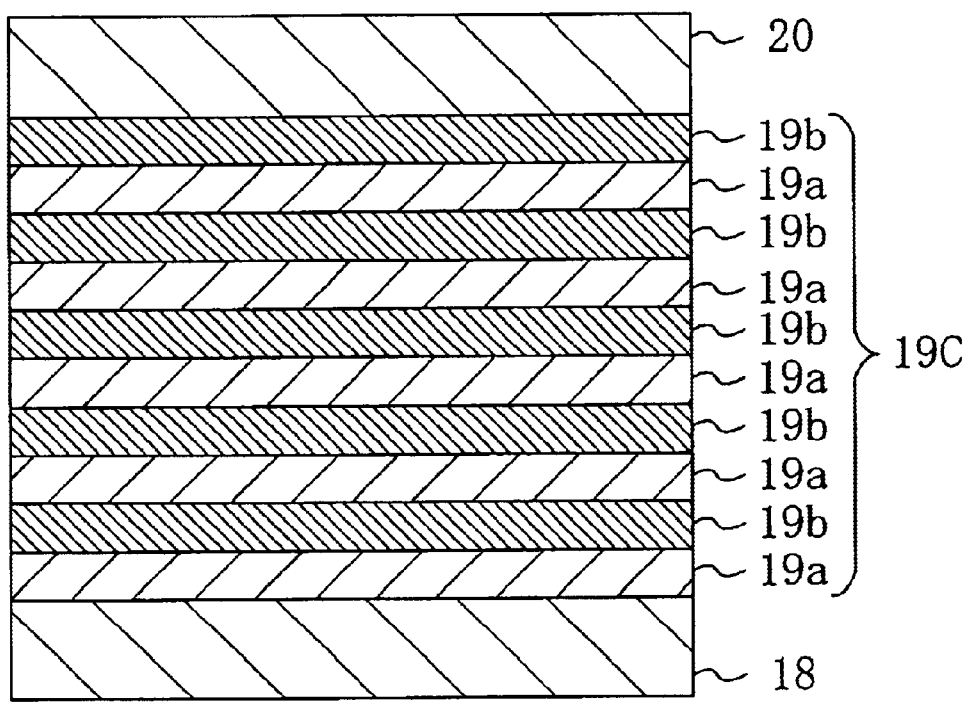
FIG. 9 is a cross-sectional view illustrating an etching stop layer in the method for manufacturing a semiconductor according to the second variation of the first embodiment of the present invention.

FIG. 9 is a cross-sectional view illustrating the etching stop layer 19C according to the second variation.

First, as illustrated in FIG. 9, the p-type first cladding layer 18 made of p-type $Al_{0.07}Ga_{0.93}N$ is grown by an MOVPE method, or the like, as in the first embodiment, after which five pairs of the first layer 19a having a thickness of about 45 nm and made of p-type $Al_{0.10}Ga_{0.90}N$ with an Mg impurity concentration of about $5\times10^{17}$ $cm^{-3}$ and the second layer 19b having a thickness of about 40 nm and made of p-type $Al_{0.02}Ga_{0.98}N$ with an Mg impurity concentration of about $5\times10^{17}$ $cm^{-3}$ are grown, thereby forming the etching stop layer 19C having a super lattice structure with a total thickness of about 425 nm. The thickness of each layer in the super lattice structure of the etching stop layer 19C is designed based on $\lambda/(4)$. Herein, $\lambda$ denotes the oscillation wavelength of the laser device, and n denotes the refractive index of each layer 19a, 19b of the super lattice structure. Since the thickness is such as to cause Bragg reflection, light (stray light) that leaks from the MQW active layer 15 to the outside is reduced, thereby improving the light confinement efficiency in the MQW active layer 15.

Then, the p-type second cladding layer 20 having a thickness of about 0.4 μm and made of p-type $Al_{0.07}Ga_{0.93}N$ with an Mg impurity concentration of about $5\times10^{17}$ $cm^{-3}$ is grown on the etching stop layer 19C.

Thereafter, as in the first embodiment, the p-type contact layer 21 is formed, and the p-type contact layer 21 and the p-type second cladding layer 20 are dry-etched into a ridge shape until the etching stop layer 19C is exposed. Moreover, a dry etching process is performed to provide the n-side electrode 23, and the p-side electrode 24 is formed.

In the semiconductor laser device of the second variation, as in the first variation, an etching time margin is provided by the etching stop layer 19C, which has a super lattice structure with five pairs of the first layer 19a made of p-type $Al_{0.10}Ga_{0.90}N$ and the second layer 19b made of p-type $Al_{0.02}Ga_{0.98}N$ and which is provided under the p-type second cladding layer 20, when performing a dry etching process on the p-type second cladding layer 20.

Therefore, while the etching amount (depth) for the p-type second cladding layer 20 is controlled by time, even when the etching time exceeds the predetermined time, the etching rate for the etching stop layer 19C is less than the etching rate for the p-type second cladding layer 20. Therefore, it is possible to easily and reliably leave a predetermined thickness of the p-type first cladding layer 18, thus improving the thickness controllability in a dry etching process.

It has been confirmed that when a direct current is actually applied, at room temperature, to a semiconductor laser device produced according to the second variation, it achieves a continuous oscillation operation with a laser oscillation threshold current of about 45 mA and a slope efficiency of about 1.0 W/A.

Thus, according to the second variation, the etching stop layer 19C having a super lattice structure is formed under the p-type second cladding layer 20 to be etched, whereby it is possible to control the thickness (remaining thickness) of the p-type first cladding layer 18 with a high precision. As a result, it is possible to obtain a desired thickness, i.e., an optimal value, for the thickness of the p-type first cladding layer 18. Therefore, the light confinement efficiency in the MQW active layer 15 is significant improved. This is because of the prevention of an etching damage to the MQW active layer 15.

In addition, the etching stop layer 19C has a super lattice structure in which the thicknesses of the first layer 19a and the second layer 19b are set so as to cause Bragg reflection, thereby improving the light confinement efficiency in the MQW active layer 15.

Moreover, the formation of the etching stop layer 19B on the substrate 11 suppresses variations in the etching remaining thickness across the surface of the substrate whose diameter is about 5.1 cm, thereby improving the yield of the semiconductor laser device and thus significantly contributing to a cost reduction.

While the etching stop layer 19A, 19B, 19C is formed on the p-type first cladding layer 18 in the first embodiment, the position where the etching stop layer 19A, 19B, 19C is formed can be easily changed through a design process because it is formed in a crystal growth process as a part of the entire growth process for forming the etching stop layer and the other semiconductor layers.

Moreover, while the etching stop layer 19A, 19B, 19C is formed across the entire surface of the p-type first cladding layer 18 in the first embodiment and in the variations thereof, it may alternatively be formed partially. In such a case, it is preferred that portions of the etching stop layer 19A, 19B, 19C are formed in a scattered manner at a number of locations, in view of the etching variations across the surface of the p-type first cladding layer 18. For example, in FIG. 5(c), when the etching stop layer 19A, 19B, 19C is formed in a region on the p-type first cladding layer 18 that is not covered by the second insulative pattern 22D, the etching stop layer 19A, 19B, 19C is eventually removed from the laser structure, and thus no longer gives any influence on the operating characteristics of the semiconductor laser device. As a result, the etching stop layer 19A, 19B, 19C is no longer restricted by the optical/electrical characteristics thereof, thus increasing the freedom in designing the etching stop layer 19A, 19B, 19C.

Moreover, while an etching process proceeds from the surface side of the substrate 11 toward the substrate 11 in the first embodiment and in the variations thereof, the present invention is not limited thereto, and it is alternatively possible to perform a dry etching process from a surface other than the surface side of the substrate 11, e.g., from the side surface, so as to selectively leave only the etching stop layer 19A, 19B, 19C to make the side surface of the deposited semiconductor layers into an indented shape. The indented shape formed on the side surface of the semiconductor may be utilized in the device formation process.

Second Embodiment

A second embodiment of the present invention will now be described with reference to the drawings.

In the first embodiment, a dry etching process on a semiconductor layer to be etched, which is formed above the etching stop layer 19A, is controlled by an etching time. In the second embodiment, an etching stop layer is optically detected so as to allow for a selective dry etching process on the semiconductor layer to be etched without relying upon the etching time.

A dry etching apparatus according to the second embodiment includes a helium (He)-cadmium (Cd) laser device and a photodetector. Thus, the surface of a sample is irradiated with an He—Cd laser beam in the dry etching apparatus without taking the sample (wafer) being etched out of the apparatus, so as to optically excite the surface of a semiconductor layer being etched and detect photoluminescence (PL) light, which is emitted after the excitation, by the photodetector.

Thus, the surface of the etching stop layer 19A can be determined in real time and in a non-contact manner by detecting, during the etching process, a change in the wavelength of the PL light, i.e., the difference between the p-type second cladding layer 20 and the etching stop layer 19A.

Figure 10:
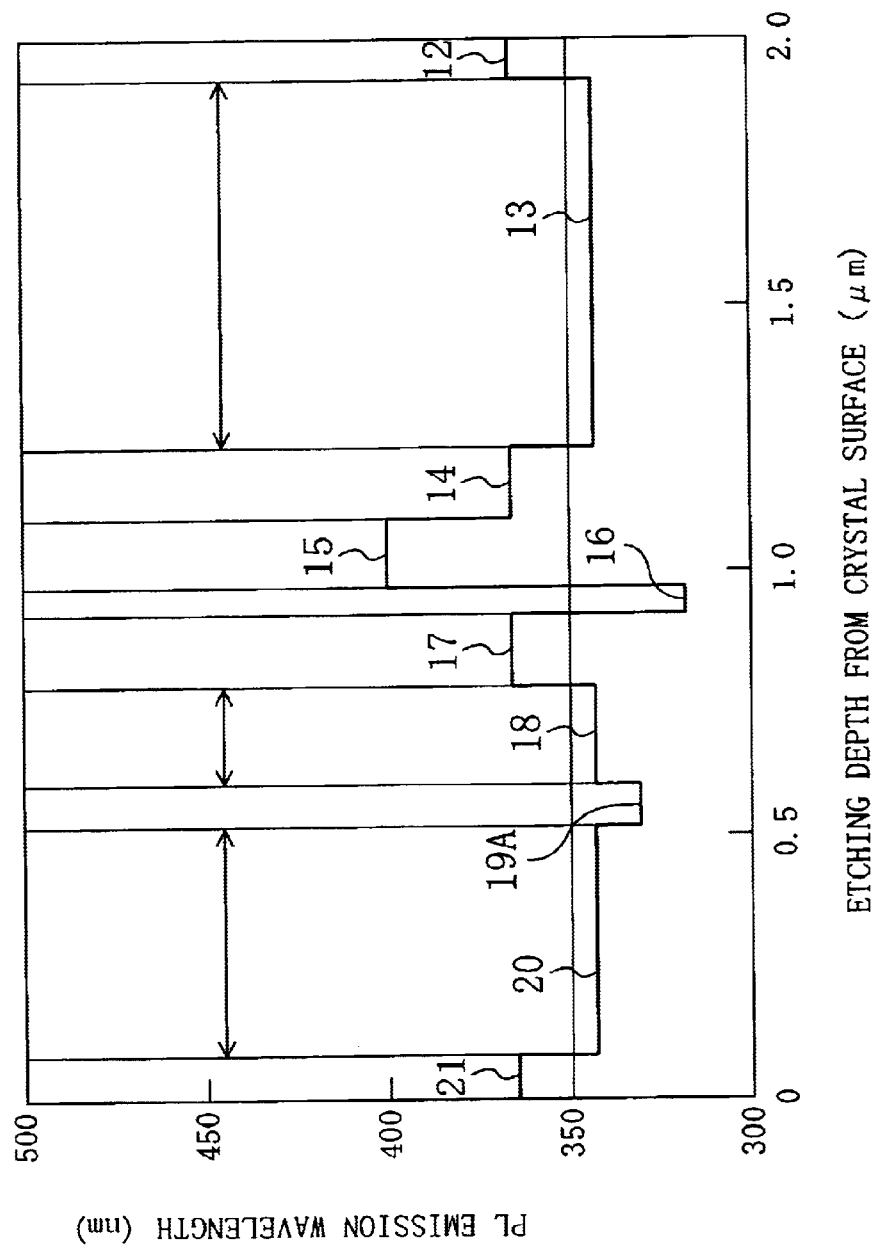
FIG. 10 is a graph illustrating the relationship between the etching depth in a group III–V nitride semiconductor after dry etching as observed by a scanning electron microscope (SEM) and the PL wavelength for each semiconductor layer, in a method for manufacturing a semiconductor according to a second embodiment of the present invention.

FIG. 10 illustrates the relationship between the etching depth in a group III–V nitride semiconductor after dry etching as observed by a scanning electron microscope (SEM) and the PL wavelength for each semiconductor layer. Herein, it is assumed that the semiconductor is the group III–V nitride semiconductor produced in the first embodiment. In FIG. 10, each graph portion corresponding to a semiconductor layer is provided with the same reference numeral as that of the semiconductor layer.

As illustrated in FIG. 10, during the etching process on the p-type second cladding layer 20, which is made of p-type $Al_{0.07}Ga_{0.93}N$, the wavelength of the detected PL light is about 350 nm in terms of the peak wavelength at room temperature. Then, as the etching process proceeds and the etching surface comes closer to the etching stop layer 19A, which is made of p-type $Al_{0.10}Ga_{0.90}N$, the wavelength of the detected PL wavelength decreases to about 345 nm, which is shorter than that for the p-type second cladding layer 20. This is greater than the Al composition of Al of the p-type second cladding layer 20, is described above.

When the etching surface reaches the uppermost surface of the etching stop layer 19A, the PL emission intensity from the etching stop layer 19A peaks. Therefore, the surface of the etching stop layer 19A can be determined also by measuring that emission intensity.

Thus, if the etching process is stopped upon detecting the PL light from the etching stop layer 19A, it is possible to reliably stop the dry etching process on the p-type second cladding layer 20 while leaving the etching stop layer 19A. As a result, it is possible to, without relying upon a time control, obtain a predetermined value for the thickness (remaining thickness) of the p-type first cladding layer 48, which influences the optical characteristics of the laser device, thereby improving the remaining thickness controllability.

Thus, according to the second embodiment, the etching stop layer 19A is formed in the semiconductor layers, as in the first embodiment, and the dry etching apparatus is provided with a laser device and a photodetector, the laser device oscillating a wavelength corresponding to an energy grater than the energy gap of the semiconductor layer to be etched. In this way, the p-type cladding layer can be processed with a high precision so that the remaining thickness thereof is equal to the desired thickness, thereby significantly improving the light confinement efficiency in the MQW active layer 15. Moreover, an etching damage to the MQW active layer 15 is prevented.

Note that the etching stop layer is not limited to the etching stop layer 19A illustrated in the first embodiment, but may alternatively be the etching stop layer 19B, 19C illustrated in the variations of the first embodiment.

Third Embodiment

A third embodiment of the present invention will now be described with reference to the drawings.

In the third embodiment, an etching stop layer is optically detected so as to allow for a selective dry etching process on the semiconductor layer to be etched without relying upon the etching time, as in the second embodiment.

A dry etching apparatus according to the third embodiment includes an X-ray generation device and an X-ray detector. Thus, the surface of the sample is irradiated with X rays in the dry etching apparatus without taking a sample (wafer) being etched out of the apparatus, so as to detect diffracted rays from the surface of the semiconductor layer being etched, by the X-ray detector. In this way, the surface of the etching stop layer 19A, which is included in the semiconductor having a structure as that of the first embodiment, can be determined in real time and in a non-contact manner.

For example, in a case where a 4-crystal x-ray diffraction (XRD) apparatus is used, the diffraction angle (2 θ) from the orientation (0002) plane, which is detected during an etching process on the p-type second cladding layer 20 made of p-type $Al_{0.07}Ga_{0.93}N$, is about 34.7°. Then, as the etching process proceeds and the etching surface comes closer to the etching stop layer 19A, which us made of p-type $Al_{0.10}Ga_{0.90}N$, the diffraction angel (2 θ) is detected to be about 34.8°. This is because the Al composition of the etching layer 19A is greater than the Al composition of Al of the p-type second cladding layer 20, as described above. Incidentally, the diffraction angle from the (0002) plane of GaN in this case is 34.6°.

When the etching surface reaches the uppermost surface of the etching stop layer 19A, the X-ray diffraction intensity from the etching stop layer 19A peaks. Therefore, the surface of the etching stop layer 19A can be determined also by measuring that diffraction intensity.

Thus, if the etching process is stopped upon detecting an X-ray diffraction angle from the etching stop layer 19A, it is possible to reliably stop a dry etching process on the p-type second cladding layer 20 while leaving the etching stop layer 19A. As a result, it is possible to, without relying upon a time control, obtain a predetermined value for the thickness (remaining thickness) of the p-type first cladding layer 48, which influences the optical characteristics of the laser device, thereby improving the remaining thickness controllability.

Thus, according to the third embodiment, the etching stop layer 19A is formed in the semiconductor layers, as in the first embodiment, and the dry etching apparatus is provided with an X-ray generation device and an X-ray detector. In this way, the p-type cladding layer can be processed with a high precision so that the remaining thickness thereof is equal to the desired thickness, thereby significantly improving the light confinement efficiency in the MQW active layer 15. Moreover, an etching damage to the MQW active layer 15 is prevented.

Note that the etching stop layer is not limited to the etching stop layer 19A illustrated in the first embodiment, but may alternatively be the etching stop layer 19B, 19C illustrated in the variations of the first embodiment.

Fourth Embodiment

A fourth embodiment of the present invention will now be described with reference to the drawings.

Figure 11:
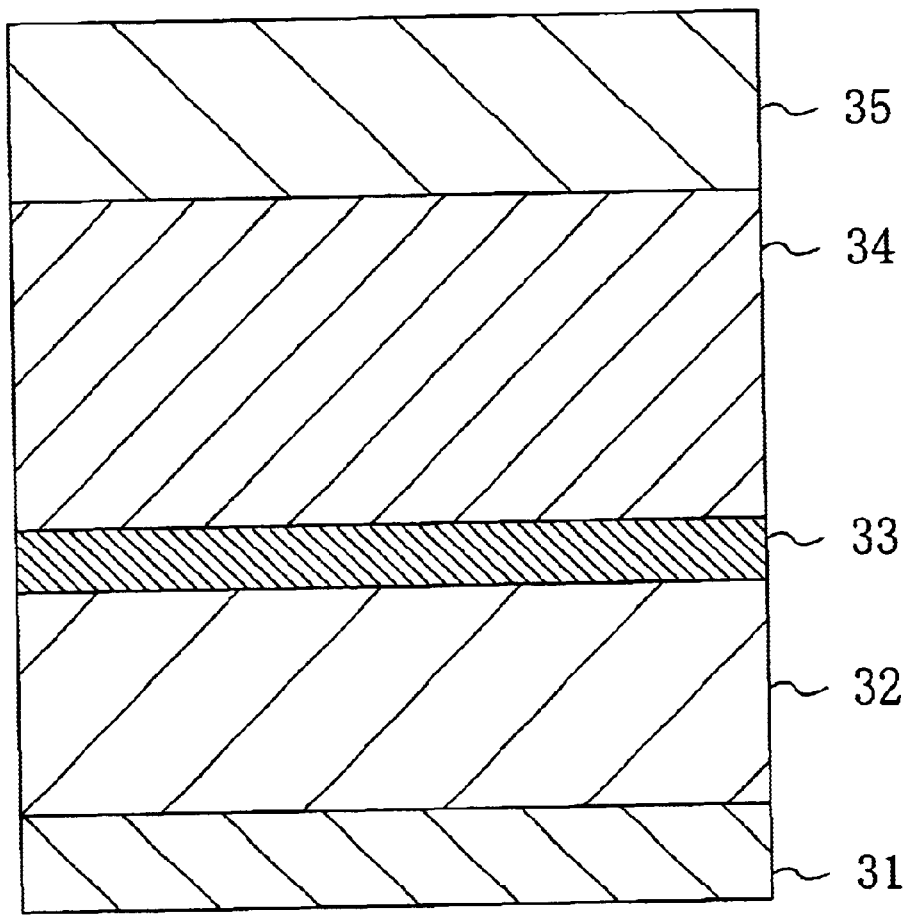
FIG. 11 is a partial cross-sectional view illustrating a region including an etching stop layer in a method for manufacturing a semiconductor according to a fourth embodiment of the present invention.

FIG. 11 is a partial cross-sectional view illustrating a method for manufacturing a semiconductor according to the fourth embodiment of the present invention, and a semiconductor laser device using the semiconductor.

In the fourth embodiment, an etching stop layer is made of an element included in a group III–V nitride semiconductor and an impurity element (dopant) that determines the conductivity of the group III–V nitride semiconductor, and particularly the etching stop layer is an insulative film made of silicon nitride (SiN).

First, as in the first embodiment, a cap layer 31 made of p-type $Al_{0.15}Ga_{0.85}N$ is grown, as illustrated in FIG. 11, by supplying TMA and TMG as group III materials, an $NH_3$ gas as a group V material, and a $Cp_2Mg$ gas as a p-type dopant, onto the substrate, while setting the temperature inside the reactor to about 1000° C. and using hydrogen as a carrier gas.

Then, a p-type light guide layer 32 having a thickness of about 100 nm and made of p-type GaN with an Mg impurity concentration of about $1\times10^{18}$ cm$^{-3}$ is grown on the cap layer 31 by stopping the supply of TMA.

Then, an $NH_3$ gas as a group V material and a carrier gas made of hydrogen are supplied onto the p-type light guide layer 32, while stopping the supply of a $Cp_2Mg$ gas containing a p-type dopant and that of TMG. Then, upon supplying an $SiH_4$ gas containing an n-type dopant, the $NH_3$ gas and the $SiH_4$ gas react with each other, whereby an etching stop layer 33 made of silicon nitride (SiN) is deposited on the p-type light guide layer 32. The thickness of the etching stop layer 33 made of SiN can be controlled based on the length of time for which the $SiH_4$ gas is supplied. Herein, the thickness is controlled to be about 20 nm.

Figure 12A:
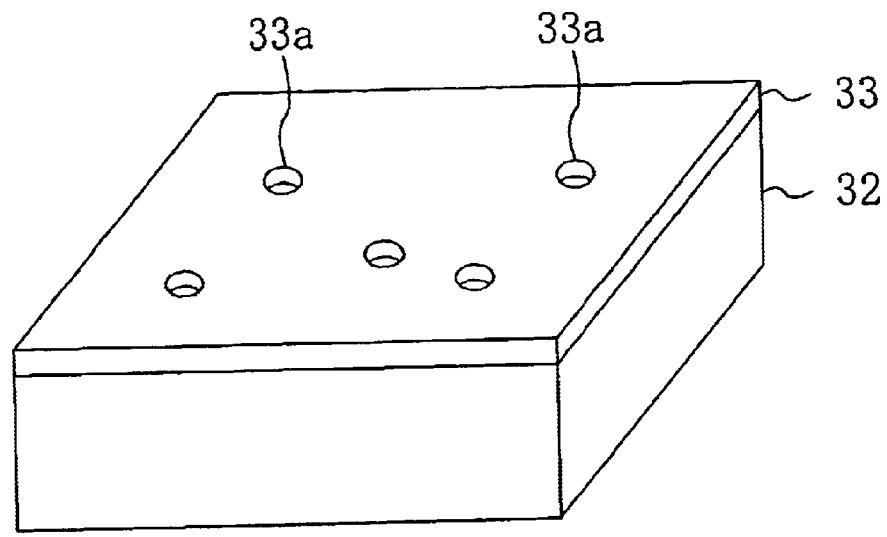
FIG. 12(a) is a perspective view illustrating an etching stop layer in the method for manufacturing a semiconductor according to the fourth embodiment of the present invention.
Figure 12B:
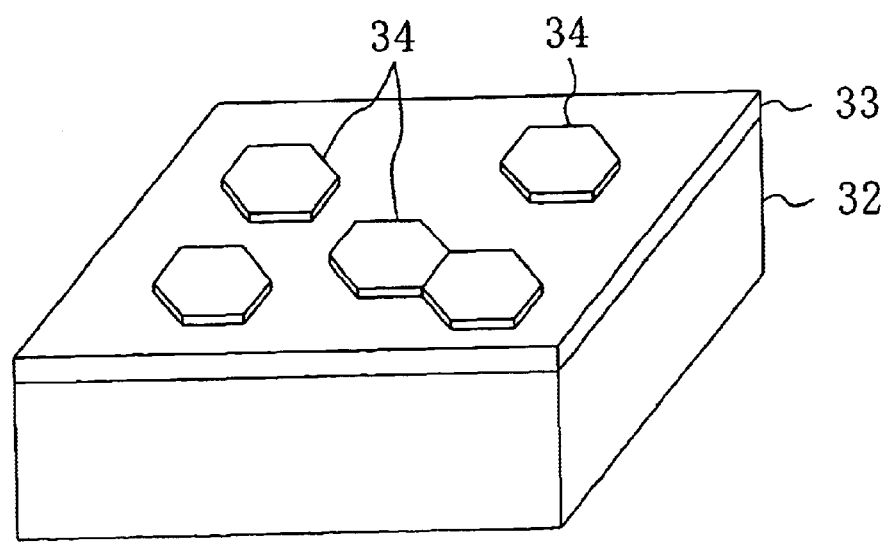
FIG. 12(b) is a perspective view illustrating a p-type cladding layer that has started to grow on the etching stop layer in the method for manufacturing a semiconductor according to the fourth embodiment of the present invention.

Then, the supply of the $SiH_4$ gas is stopped, TMG, TMA and the $Cp_2Mg$ gas are supplied again onto the etching stop layer 33, thereby growing a p-type cladding layer 34 having a thickness of about 0.7 μm and made of p-type $Al_{0.07}Ga_{0.93}N$ with an Mg impurity concentration of about $5\times10^{17}$ cm$^{-3}$. In this case, the growth of the p-type cladding layer 34 on the etching stop layer 33 is relatively easy. This is because the etching stop layer 33 is not a uniform, compact film, but includes therein holes 33a such that the p-type light guide layer 32 is partially exposed, as illustrated in FIG. 12(a). As a result, the p-type cladding layer 34 selectively grows through the holes 33a, as illustrated in FIG. 12(b). However, if the thickness of the etching stop layer 33 is excessive, the holes 33a may possibly disappear. Therefore, it is preferred that the thickness of the etching stop layer 33 is about 100 nm or less.

While the etching stop layer 33 is formed on the p-type light guide layer 32 in the fourth embodiment, the position where it is formed can be easily changed through a design process because the etching stop layer 33 is formed as a part of the entire crystal growth process. However, it is possible that the p-type cladding layer 34 is polycrystallized while the p-type cladding layer 34 is grown on the etching stop layer 33. This is because of the small diffusion length of aluminum in a growth process. In such a case, it is possible to suppress the polycrystallization of the p-type cladding layer 34 by growing a p-type GaN layer containing no aluminum on the etching stop layer 33 and then growing the p-type cladding layer 34 made of p-type $Al_{0.07}Ga_{0.93}N$.

Thereafter, a p-type contact layer 35 having a thickness of about 0.1 μm and made of p-type GaN with an Mg impurity concentration of about $1\times10^{18}$ cm$^{-3}$ is grown on the p-type cladding layer 34.

Then, as in the first embodiment, the p-type contact layer 35 and the p-type cladding layer 34 are patterned into a ridge shape through a dry etching process. At this time, since the etching stop layer 33 made of SiN has an etching rate about 1/100 of the etching rate of the p-type cladding layer 34 made of AlGaN, the etching stop layer 33 is less easily etched as compared with the p-type cladding layer 34, whereby the etching stop layer 33 can sufficiently exert its function.

The etching process on the p-type cladding layer 34 in a dry etching process can be monitored as in the second embodiment. In a case where PL light is observed, it can be determined that the etching process in progress has reached the etching stop layer 33 based on a phenomenon that a PL spectrum corresponding to the p-type cladding layer 34 disappears while another PL spectrum corresponding to the p-type light guide layer 32 does not appear.

In a case where X-rays are used for monitoring an etching process, as in the third embodiment, it can be determined that the etching process in progress has reached the etching stop layer 33 based on a phenomenon that a diffraction peak corresponding to the p-type cladding layer 34 disappears, followed by the appearance of another diffraction peak corresponding to the etching stop layer 33, whose peak intensity becomes maximum.

When a direct current is actually applied, at room temperature, to a semiconductor laser device produced according to the fourth embodiment, it achieves a continuous oscillation operation with the operating characteristics thereof being as those of the semiconductor laser device according to the first embodiment. Since the etching stop layer 33 of the fourth embodiment is insulative, the current injection into the active layer may possibly be difficult. However, it has been confirmed that the current injection is not inhibited in the semiconductor laser device of the fourth embodiment. It is believed that this is because the thickness of the etching stop layer 33 is reduced to about 20 nm, whereby the injected current passes through the etching stop layer 33 as a tunneling current.

Thus, according to the fourth embodiment, the etching stop layer 33 is formed under the p-type cladding layer 34 to be etched, whereby it is possible to control the thickness (remaining thickness) of the p-type cladding layer 34 with a high precision. Therefore, underetching of the p-type cladding layer 34 does not occur, while it is possible to obtain a desired thickness, i.e., an optimal value. As a result, the light confinement efficiency in the MQW active layer is significantly improved. This is because of the prevention of an etching damage to the MQW active layer.

Moreover, the formation of the etching stop layer 33 on the substrate suppresses variations in the etching remaining thickness across the surface of the substrate whose diameter is about 5.1 cm, thereby improving the yield of the semiconductor laser device and thus significantly contributing to a cost reduction.

While the etching stop layer 33 is formed across the entire surface of the p-type cladding layer 32 in the fourth embodiment, it may alternatively be formed partially. In such a case, it is preferred that portions of the etching stop layer 33 are formed in a scattered manner at a number of locations, in view of the etching variations across the surface of the p-type cladding layer 32. For example, if it is formed in a region on the p-type cladding layer 32 that is to be removed from the laser structure, it no longer gives any influence on the operating characteristics of the semiconductor laser device. As a result, the etching stop layer 33 is no longer restricted by the optical/electrical characteristics thereof, thus increasing the freedom in designing the etching stop layer 33.

Moreover, while an etching process proceeds from the surface side of the substrate toward the substrate in the fourth embodiment, the present invention is not limited thereto, and it is alternatively possible to perform a dry etching process from a surface other than the surface side of the substrate, e.g., from the side surface, so as to selectively leave only the etching stop layer 33 to make the side surface of the deposited semiconductor layers into an indented shape. The indented shape formed on the side surface of the semiconductor may be utilized in the device formation process.

Fifth Embodiment

A fifth embodiment of the present invention will now be described with reference to the drawings.

Figure 13:
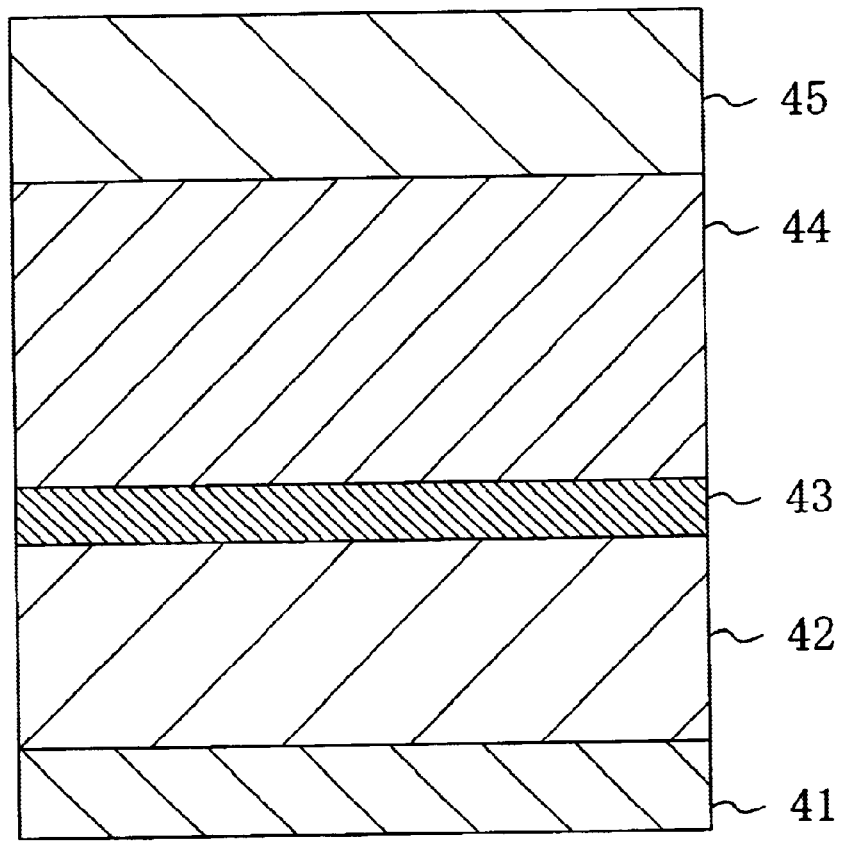
FIG. 13 is a partial cross-sectional view illustrating a region including an etching stop layer in a method for manufacturing a semiconductor according to a fifth embodiment of the present invention.

FIG. 13 is a partial cross-sectional view illustrating a method for manufacturing a semiconductor according to the fifth embodiment of the present invention, and a semiconductor laser device using the semiconductor.

In the fifth embodiment, an etching stop layer is made of an element included in a group III–V nitride semiconductor and an impurity element (dopant) that determines the conductivity of the group III–V nitride semiconductor, and particularly the etching stop layer is a conductive film made of a group III–V nitride semiconductor containing a p-type impurity at a high concentration.

First, as in the first embodiment, a cap layer 41 made of p-type $Al_{0.15}Ga_{0.85}N$ is grown, as illustrated in FIG. 13, by supplying TMA and TMG as group III materials, an $NH_3$ gas as a group V material, and a $Cp_2Mg$ gas a p-type dopant, onto the substrate, while setting the temperature inside the reactor to about 1000° C. and using hydrogen as a carrier gas.

Then, a p-type light guide layer 42 having a thickness of about 100 nm and made of p-type GaN with an Mg impurity concentration of about $1\times10^{18}$ cm$^{-3}$ is grown on the cap layer 41 by stopping the supply of TMA.

Then, only the $Cp_2Mg$ gas is excessively supplied while maintaining the amount of supply of TMG during the growth of the p-type light guide layer 42. If the $Cp_2Mg$ gas is supplied excessively, the impurity concentration of magnesium (Mg) in the p-type GaN layer, which is grown on the upper surface of the p-type light guide layer 42, increases, thereby growing an etching stop layer 43 made of $p^+$-type GaN. The thickness of the etching stop layer 43 made of $p^+$-type GaN can be controlled based on the length of time for which the $Cp_2Mg$ gas is supplied. Herein, the thickness is controlled to be about 20 nm.

Specifically, the etching stop layer 43 is grown by increasing the amount of supply of the $Cp_2Mg$ gas by one order of magnitude, from about $1\times10^{19}$ cm$^{-3}$ ($1\times10^{18}$ cm$^{-3}$ in terms of the Mg impurity concentration) to about $1\times10^{20}$ cm$^{-3}$, as measured by a secondary ion mass spectrometry (SIMS) method.

Then, a p-type cladding layer 44 having a thickness of about 0.7 μm and made of p-type $Al_{0.07}Ga_{0.93}N$ with an Mg impurity concentration of about $5\times10^{17}$ cm$^{-3}$ is grown by supplying again TMA onto the etching stop layer 43 while setting the amount of supply of the $Cp_2Mg$ gas back to the original value. Then, a p-type contact layer 45 having a thickness of about 0.1 μm and made of p-type GaN with an Mg impurity concentration of about $1\times10^{18}$ cm$^{-3}$ is grown on the p-type cladding layer 44 by stopping the supply of TMA. However, since the amount of Mg being introduced is excessive, hillock may occur in the p-type cladding layer 44 when growing the p-type cladding layer 44 on the etching stop layer 43, thereby deteriorating the crystal surface condition (morphology) of the etching stop layer 43. In such a case, it is possible to suppress the deterioration of the crystal surface condition by setting the thickness of the etching stop layer 43 to about 100 nm or less.

While etching stop layer 43 is formed on the p-type light guide layer 42 in the fifth embodiment, the position where it is formed can be easily changed through a design process because the etching stop layer 43 is formed as a part of the entire crystal growth process.

Thereafter, as in the first embodiment, the p-type contact layer 45 and the p-type cladding layer 44 are patterned into a ridge shape through a dry etching process. At this time, since the etching stop layer 43, whose Mg concentration is about $1 \times 10^{20}$ cm$^{-3}$ as measured by an SIMS method, has an etching rate about $1/50$ of the etching rate of the p-type cladding layer 44, whose Mg impurity concentration is about $5 \times 10^{17}$ cm$^{-3}$, the etching stop layer 43 is less easily etched as compared with the p-type cladding layer 44, whereby the etching stop layer 43 can sufficiently exert its function. Moreover, the etching stop layer 43 is conductive, whereby it will not inhibit the injection current into the active layer and will not adversely affect the operating characteristics of the laser device.

The etching process on the p-type cladding layer 44 in a dry etching process can be monitored as in the second embodiment. In a case where PL light is observed, it can be determined that the etching process in progress has reached the etching stop layer 43 based on a phenomenon that a PL spectrum corresponding to the p-type cladding layer 44 disappears while another PL spectrum at a wavelength of about 420 nm that is caused by the etching stop layer 43 appears. In this case, the 420-nm PL spectrum is caused by the excessive introduction of magnesium into the etching stop layer 43.

In a case where X-rays are used for monitoring an etching process, as in the third embodiment, it can be determined that the etching process in progress has reached the etching stop layer 43 at the time when a diffraction peak corresponding to the p-type cladding layer 44 disappears.

When a direct current is actually applied, at room temperature, to a semiconductor laser device produced according to the fifth embodiment, it achieves a continuous oscillation operation with the operating characteristics thereof being as those of the semiconductor laser device according to the first embodiment.

Thus, according to the fifth embodiment, the etching stop layer 43 is formed under the p-type cladding layer 44 to be etched, whereby it is possible to control the thickness (remaining thickness) of the p-type cladding layer 44 with a high precision. Therefore, underetching of the p-type cladding layer 44 does not occur, while it is possible to obtain a desired thickness, i.e., an optimal value. As a result, the light confinement efficiency in the MQW active layer is significantly improved. This is because of the prevention of an etching damage to the MQW active layer.

Moreover, the formation of the etching stop layer 43 on the substrate suppresses variations in the etching remaining thickness across the surface of the substrate whose diameter is about 5.1 cm, thereby improving the yield of the semiconductor laser device and thus significantly contributing to a cost reduction.

While the etching stop layer 43 is formed across the entire surface of the p-type cladding layer 42 in the fifth embodiment, it may alternatively be formed partially. In such a case, it is preferred that portions of the etching stop layer 44 are formed in a scattered manner at a number of locations, in view of the etching variations across the surface of the p-type cladding layer 42. For example, if it is formed in a region on the p-type cladding layer 42 that is to be removed from the laser structure, it no longer gives any influence on the operating characteristics of the semiconductor laser device. As a result, the etching stop layer 43 is no longer restricted by the optical/electrical characteristics thereof, thus increasing the freedom in designing the etching stop layer 43.

Moreover, while an etching process proceeds from the surface side of the substrate toward the substrate in the fifth embodiment, the present invention is not limited thereto, and it is alternatively possible to perform a dry etching process from a surface other than the surface side of the substrate, e.g., from the side surface, so as to selectively leave only the etching stop layer 43 to make the side surface of the deposited semiconductor layers into an indented shape. The indented shape formed on the side surface of the semiconductor may be utilized in the device formation process.

In the first embodiment, and the variations thereof, to the fifth embodiment described above, a group III–V nitride semiconductor is used as a compound semiconductor to be epitaxially grown. Alternatively, it may be any other group III–V compound semiconductor such as gallium arsenide (GaAs) or indium phosphide (InP).

Moreover, the semiconductor layer formed under the etching stop layer may alternatively be a group II–VI compound such as zinc selenide (ZnSe).

Moreover, the structure of the semiconductor laser device is not limited to the structure illustrated in FIG. 5(a), etc.

Moreover, the semiconductor device is not limited to a laser device, but may alternatively be any other semiconductor device which includes a group III–V compound semiconductor and which requires an operation of selectively processing the group III–V compound semiconductor in a dry etching process during the manufacture thereof.

What is claimed is:

1. A method for manufacturing a semiconductor laser optical device, comprising:

a first step of forming an etching stop layer on a first semiconductor layer; and a second step of forming a second semiconductor layer made of a group III–V compound semiconductor on the etching stop layer, wherein an etching rate for the etching stop layer by dry etching is less than an etching rate for the second semiconductor layer, and in the first step, the etching stop layer is a super lattice layer obtained by alternately layering an $Al_xGa_{1-x}N$ layer (where $0 \leq x \leq 1$) and an $Al_yGa_{1-y}N$ layer (where $0 \leq y \leq 1$ and $x \neq y$) on one another, thereby functioning as a reflector mirror having a thickness such as to reflect light whose wavelength is equal to or greater then about 360 nm and less than or equal to 500 nm and the thickness of each $Al_xGa_{1-x}N$ and each $Al_yGa_{1-y}N$ layer is $\lambda/(4n)$ wherein $\lambda$ denotes an oscillation wavelength of the semiconductor laser optical device, and n denotes a refractive index of each $Al_xGa_{1-x}N$ layer and each $Al_yGa_{1-y}N$ layer.

* * * * *

UNITED STATES PATENT AND TRADEMARK OFFICE
CERTIFICATE OF CORRECTION

PATENT NO. : 6,709,881 B2
DATED : March 23, 2004
INVENTOR(S) : Yoshiaki Hasegawa et al.

It is certified that error appears in the above-identified patent and that said Letters Patent is hereby corrected as shown below:

<u>Title page, Item [54] and Column 1, line 1,</u>
Title, change "METHOD FOR MANUFACTURING SEMICONDUCTOR AND METHOD FOR MANUFACTURING SEMICONDUCTOR DEVICE" to
-- METHOD FOR MANUFACTURING SEMICONDUCTOR LASER OPTICAL DEVICE --.

Signed and Sealed this

Twentieth Day of September, 2005

JON W. DUDAS
*Director of the United States Patent and Trademark Office*